United States Patent [19]

Constant

[11] 4,228,517

[45] Oct. 14, 1980

[54] RECURSIVE FILTER

[75] Inventor: James N. Constant, 1603 Danbury Dr., Claremont, Calif. 91711

[73] Assignee: James N. Constant, Claremont, Calif.

[21] Appl. No.: 970,648

[22] Filed: Dec. 18, 1978

Related U.S. Application Data

[63] Continuation-in-part of Ser. No. 698,101, Jun. 21, 1976, abandoned.

[51] Int. Cl.³ .............................................. G06F 15/31
[52] U.S. Cl. .................................. 364/724; 364/745; 375/12; 375/103
[58] Field of Search .................. 364/724, 745; 325/42

[56] References Cited

U.S. PATENT DOCUMENTS

| 3,370,292 | 2/1968 | Deerfield | 364/724 X |
| 3,648,171 | 3/1972 | Hirsch | 325/42 |
| 3,777,130 | 12/1973 | Croisier et al. | 364/724 |
| 3,950,635 | 4/1976 | Constant | 364/724 |
| 4,038,536 | 7/1977 | Feintuch | 364/724 |

OTHER PUBLICATIONS

Tran-Thong et al., "Limit Cycles in the Combinatorial Implementation of Digital Filters", *IEEE Trans. on A.S.S.P.*, Jun. 1976, pp. 248–256.

*Primary Examiner*—Jerry Smith
*Attorney, Agent, or Firm*—Harris, Kern, Wallen & Tinsley

[57] ABSTRACT

A recursive filter characterized by increased efficiency and accuracy and incorporating a step decision circuit which reduces filter noise, error and size. Efficiency is obtained by reducing the requirement for bulk memory and the number of multipliers while accuracy is obtained by reducing error portions of data and coefficient words in the filter.

25 Claims, 4 Drawing Figures

RECURSIVE FILTER

CROSS-REFERENCE TO RELATED APPLICATION

This application is a continuation-in-part of copending application Ser. No. 698,101, filed June 21, 1976, entitled Recursive Filter and now abandoned.

BACKGROUND OF THE INVENTION

The present invention relates to analog and digital filtering and more particularly to the implementation of improved recursive filters.

Two types of filters are known in the prior art: the nonrecursive and recursive types. Both types employ delay lines tapped at the data time interval. The great success in the development of digital filters has led to a number of powerful methods for the synthesis of these filters but with little, if any, corresponding applications of these methods to the synthesis of analog filters. For example, a most powerful algorithm for the synthesis of a digital filter is the difference equation $$y_n = \sum_{i=0}^{N} \alpha_i x_{n-i} - \sum_{j=1}^{N} \beta_j y_{n-j} \quad (1)$$

where $x_n$ is the input sequence of words to the filter, $y_n$ is the output sequence, and the $\alpha$'s and $\beta$'s are the filter coefficients. Generally, the coefficients are non-zero numbers but $\alpha = 0$ defines a special case filter.

The synthesis of filters using equation (1) is the so-called recursive method and leads to the direct, cascade and parallel forms of filters, for example as shown in the paper by S. Freeney "Special Purpose Hardware for Digital Filtering" appearing in the April 1975 issue of Proceedings IEEE. However, filters can also be synthesized using equally well known alternative methods, for example using the discrete Fourier transform (DFT) and convolution. The system of the invention is based on the recursive method of equation (1) and, significantly, applies this equation to the synthesis of analog filters as well. For analog filters, the summation signs in equation (1) must be replaced by integrals.

In general, prior art filters fall into two broad categories: those employing acoustic and non-acoustic means. Included in the former category are sonic, magnetostrictive, acoustic surface wave, and optoacoustic filters while the latter category comprises charge coupled devices, binary shift registers and random access memories. Acoustic filters have been described in the paper by Squire et al., "Linear Signal Processing and Ultrasonic Transversal Filters" appearing in the November 1969 issue of IEEE Transactions on Microwave Theory and Techniques and in the May 1976 Special Issue on Surface Wave Devices and Applications of the IEEE Proceedings, while non-acoustic filters have been described in the paper by Brown et al "Signal Processing Device Technology" appearing in the Proceedings of the NATO Advanced Study Institute on Signal Processing held at the University of Technology, Loughborough, U.K. on Aug. 21 through Sept. 1, 1972, in the book edited by Rabiner and Rader "Digital Signal Processing" IEEE Press 1972, in the book by Rabiner and Gold "Theory and Applications of Digital Signal Processing" Prentice-Hall 1975, and in U.S. Pat. No. 3,950,635 for a Digital Matched Filter and Correlator using Random Access Memory.

As a rule, if interruptions of the processing are infrequent then acoustic filters are preferred since they offer large storage capacity, convenient tapping of delay lines, and low power consumption. When short duration interruptions of the processing may occur, then charge coupled devices with their controllable clock rates offer the advantages of small size, offset only by charge transfer inefficiency and temperature sensitivity. When frequent processing interrupts are required, digital implementations in the form of shift registers and memory delay lines are indicated. The rapid development of solid state technology however favors digital devices and these by far now have become available commercially although they are limited inherently by their lack of speed when compared to analog devices.

The nonrecursive filter selectively attenuates (multiplies) each tap output, combines and feeds forward the attenuated outputs to form the filter output. If the nonrecursive filter is used as an equalizer it further derives an error control signal to drive the attenuators. This is done by comparing the filter output with a desired output based on some distortion criterion, usually taken to be the mean square error between the filtered and desired signals. The mean square error difference is known to be a convex function of the attenuator settings. Therefore, repeated attenuator adjustments tend to converge on the minimum residual distortion. An example of the nonrecursive filter as an adaptive equalizer is disclosed in R. Luckey U.S. Pat. No. 3,414,819 issued Dec. 3, 1968.

Two noteworthy disadvantages of the prior art non-recursive filter have been identified. One is noise enhancement which tends to occur because noise present in the input signal is propagated down the delay line and, after some attenuation, is added to the unattenuated signal occuring at the reference tap. From every non-zero attenuator setting a degree of noise enhancement can thus result. The other disadvantage is extension of the filtered impulse response over more intervals than the unfiltered response due to the fact that each echo of the original impulse being filtered produces a secondary echo of its own in the filter's adder.

The recursive filter selectively attenuates (multiplies) each tap output also, but two sets of summation result. The summation of one set is fed forward to form a filter output, as in the nonrecursive filter; but the summation of the other set is fed back and combined with the input signal to be filtered or with the summation of the one set. Whereas the feedforward attenuator settings determine the zeros of a transfer function generated by the filter in the same manner as the nonrecursive filter, the feedback attenuator settings determine the poles or frequencies of natural resonnance of the same transfer function. The adjustment of the feedforward attenuators can be accomplished automatically as in the nonrecursive filter but the adjustment of the feedback attenuators is not as readily accomplished for two reasons: first, if the amount fed back exceeds unity, the filter becomes unstable and, second, the error is not necessarily a convex function of the attenuator settings except in certain ranges. the recursive filter is also subject to an error propagation penalty in that an error once fed back corrupts at least as many subsequent data samples as there are feedback attenuators. In fact, initial errors may corrupt later data samples by being fed back more than once.

When applied to digital filters, it is necessary that the terms of equation (1) be expressed with digital words of finite length, i.e., they must be quantized. The effects of such quantization lead to errors due to the coefficient quantization, data quantization, roundoff errors, and errors due to the so-called limit cycles and overflow, for example as discussed in Chapter 5 of the book by L. Rabiner and B. Gold. In general, the effects of quantization are decreased by lengthening digital words for the coefficients and data. However, the number of bits of word length used has a strong effect on the amount of hardware required to build the digital filter.

The direct, cascade and parallel forms of a digital filter in the prior art utilize N or 2 N words of data storage and employ 2 N multipliers for performing the filtering of signals. Since multipliers are the most complex and least efficient elements in a digital filter, the implemantation of N-word digital filters becomes increasingly difficult as N increases. On the other hand, while multipliers are less critical in analog filters, the tapping of analog delay lines becomes difficult at the highest frequencies and, the implementation of N-word analog filters becomes difficult as N increases. It is desired therefore to implement a filter which requires only a single pair of multipliers and in this manner to provide new and improved filters while significantly decreasing the weight, size, power consumption and cost for such devices. However, while this is possible when implementing nonrecursive filters it will not work when implementing recursive filters. Examples of analog and digital nonrecursive filters which use a single multiplier have been disclosed in M. Swan U.S. Pat. No. 3,449,553 issued June 10, 1969 and in J. Constant U.S. Pat. No. 3,950,635 issued Apr. 13, 1976. There is no known disclosure of a recursive filter with dual multipliers for the simple reason the multiplier capacity increases in the simplified filter, as will more fully become apparent in the later portion of this disclosure.

In the prior art, bulk memory was used in a digital filter as a technique for simplifying or even eliminating the multiplier portions of such filters. If the coefficients could be read out from the bulk memory only when used then the number of multipliers might be reduced or eliminated. For example, such an approach for a nonrecursive transversal digital filter is shown in L. Jackson U.S. Pat. No. 3,522,546 issued Aug. 4, 1970. In a related development, A. Deerfield in U.S. Pat. No. 3,370,292 issued Feb. 20, 1968 teaches that a reference table addressable by an intermediate value in a digital filtering sequence can be used to provide values that can be logically combined with input signals in a feedforward and feedbck paths of a recursive filter. However, the Deerfield arrangment was concerned neither with optimum memory capacity, multiplier elimination, or the use of the input signal elements to directly access the stored values of interest. The Deerfield oversight has been solved by A. Croisier et al in U.S. Pat. No. 3,777,130 issued on Dec. 4, 1973 who teach the use of a bulk memory to obtain the intermediate values, which values are subsequently accumulated. The Croisier arrangement minimizes the memory capacity and altogether eliminates multipliers. Thus, the prior art filters were concerned with optimizing the memory capacity and reducing or eliminating multipliers but, with several exceptions, nowhere does the prior art suggest or teach how to improve the stability and error problems of recursive filters. One known exception is the filter disclosed by D. Hirsch in U.S. Pat. No. 3,648,171 issued Mar. 7, 1972 which teaches the use of a cascade of two nonrecursive filters to obtain the improved performance of an equivalent recursive filter-equalizer. The other known exception is the cascading and paralleling of low order recursive filters to obtain the improved performance of an equivalent recursive filter, for example as shown in Freeney. In general, the accuracy of a filter improves as the length of data and coefficient words is increased. And, it has been found that the accuracy of a cascade or parallel realization of a filter is considerably better than that which can be achieved by a direct realization. It is for this reason that filter designers concentrate on first and second order filters which then become the building blocks for higher order recursive filters.

From the discussion above it is clear that the prior art realization of direct form recursive filters, for all practical purposes, has not been completely successful for reducing the memory capacity, reducing or eliminating multipliers and at the same time, increasing the filter accuracy. For example, the time sharing of multipliers in nonrecursive filters (Swan and Constant patents) when applied to a direct form recursive filter will in fact degrade the accuracy, while the substitution of bulk memory for multipliers (Deerfield and Croisier patents) trades the former for the latter with little impact on the filter accuracy. This predicament of the prior art leaves the cascading and paralleling of low order recursive filters as the only practical way of obtaining higher order and accuracy recursive filters. As a consequence, the prior art recursive filters fall short when the size, power consumption and cost are considered in devices requiring large N words of storage.

It is the purpose of the present invention to produce direct forms of recursive filters capable of improving the memory and accuracy limitations of the prior art devices by at least one order of magnitude, at reduced size, power consumption and cost.

SUMMARY OF THE INVENTION

It is the object of this invention to provide apparatus and method for a direct form recursive filter having a reduced number of or no multipliers. It is another object of this invention to provide such a filter having improved accuracy. It is another object of this invention to provide such a filter used as an equalizer (adaptive filter).

According to this invention, a step decision circuit can be used at the output of the nonrecursive (feed forward) portion of a direct form recursive filter to obtain the feedback and filter output signals. The step decision circuit acts as a variable threshold to reduce the noise and errors which otherwise would tend to propagate in the filter.

It is a general purpose of this invention to provide small size, low power consumption and low cost apparatus for the implementation of high capacity direct form recursive filters. Utilizing the system of the present invention, the analog and digital filtering of signals may be accomplished efficiently and economically in real time.

Particular objectives of the invention are to provide a number of useful configurations of the system and thereby to provide new and improved direct form recursive filters and filtering methods.

BRIEF DESCRIPTION OF THE DRAWINGS

The above and other objects and features of the invention will be appreciated from a consideration of the following description and the drawings in which.

DESCRIPTION OF THE PREFERRED EMBODIMENTS

Figure 1:
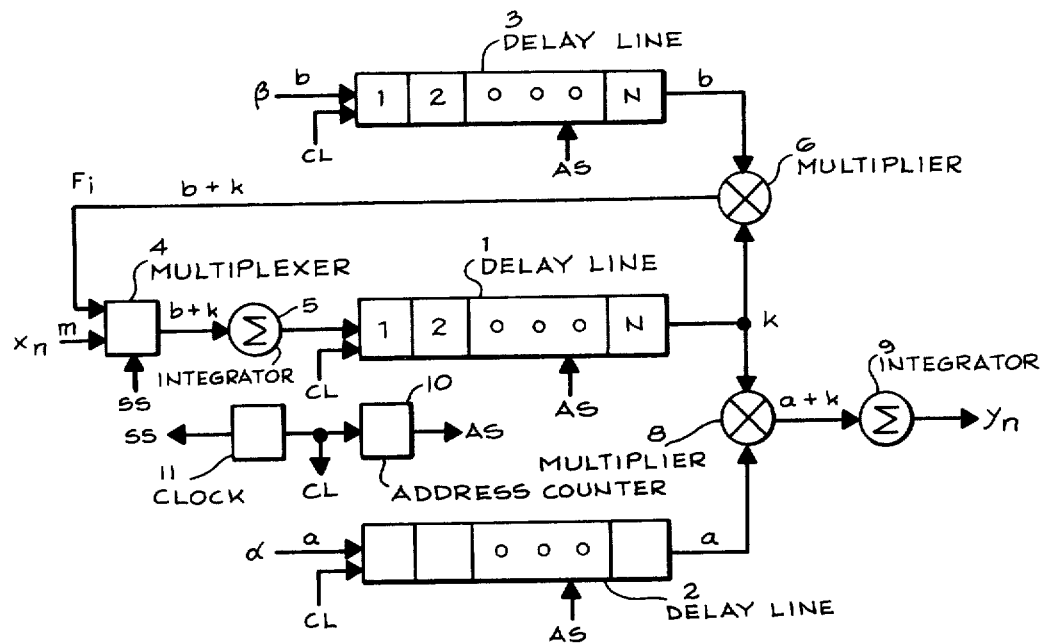
FIG. 1 is a block diagram of a direct canonical form of a recursive filter sharing the same data memory

FIG. 1 shows the block diagram of a direct form recursive filter sharing the same data memory 1. Input word sequence $x_n$, $n = 1, 2, \ldots, N$, is applied to N-word delay line 1 on m lines through multiplexer 4 and feedback integrator 5, while coefficient sequences $\alpha, \beta$ are applied directly to memories (delay lines) 2, 3 on a and b lines, respectively. Multiplexer 4 also receives input the output of feedback multiplier 6. The input of feedback multiplier 6 is the combined output of delay lines 1, 3. Feedforward multiplier 8 receives as input the combined output of delay lines 1, 2 and provides its output to feedforward integrator 9 whose output is the desired function $y_n$ given by the direct filter form of equation (1).

That the system of FIG. 1 is the direct form of a recursive filter may be easily seen by comparing it with a prior art system, for example FIG. 1 of the reference by Freeney, wherein the output $y_n$ appears upon application of the input $x_n$ to an N-word delay line using 2 N multipliers to obtain the coefficients $\alpha, \beta$ simultaneously. While the Freeney system can be used by the invention, the system of FIG. 1 uses a single pair of multipliers 6, 8 to obtain coefficients $\alpha, \beta$ in time sequence, i.e., in time intervals between application of words in the input sequence of words $x_n$. Thus, in FIG. 1, words 1, 2, ..., N in delay lines 1, 2, 3 are synchronously outputted in sequence to multipliers 6, 8, which play the role of feedback and feedforward multipliers of a recursive filter and replacing the 2 N multipliers of the prior art. And, integrators 5, 9 are needed as in the prior art, excepting these are for serially integrating the time sequence 1, 2, ..., N applied to their inputs. Multiplexer 4 and integrator 5 may provide for the rotation and shifting of words 1, 2, ..., N in delay line 1 following the application of each input word $x_n$. Multiplexer 4 passes word $x_n$ and feedback words $F_i$, $i = 1, 2, \ldots, N$ in time sequence to integrator 5 which serially accumulates and integrates word $x_n$ and feedback words $F_i$. Integrator 5 then provides the integrated word to delay line 1 which may be a non-recirculating or recirculating memory. For example, delay line 1, multiplexer 4, integrator 5 and multiplier 6 may follow the form of a DELTIC (recirculating) RAM more fully described in U.S. Pat. No. 3,950,635 except now the integrator 5 and multiplier 6 are needed in the feedback loop. Delay lines 2, 3 may also be DELTIC or non-DELTIC RAMs so that for each input word $x_n$ applied to the input of multiplexer 4, delay lines 1, 2, 3 will synchronously output the sequence of words 1, 2, ..., N to multipliers 6, 8 forming along with integrators 5, 9 the feedback and feedforward portions of the recursive filter and shifting their word contents by one word prior to the application of the next word in input word sequence $x_n$. Thus, means are provided for rotating and shifting words 1, 2, ..., N is delay lines 1, 2, 3. However, the shifting of words in delay lines 2, 3 is needed only for loading coefficients $\alpha, \beta$. When loaded, words 1, 2, ..., N in delay lines 2, 3 need only be rotated between samplings of signal $x_n$ in programmable systems. In non-programmable (fixed coefficient) systems, delay lines 2, 3 may be replaced by a fixed set of voltages, for example zeros and ones in digital systems.

It should be understood in digital implementations that input word sequences $x_n$, $\alpha, \beta$ and resulting sequences to and from multipliers 6, 8, multiplexer 4 and integrators 5, 9 are carried on a number of lines, for example on m, a, b, a+k, b+k lines as shown in FIG. 1, i.e., having word lengths as desired. Also, while input coefficient sequences $\alpha, \beta$ are shown carried on a and b lines, respectively, these may in fact may be carried on any number of lines as desired, i.e., the word lengths of coefficients $\alpha, \beta$ need not be the same as the word length of input word $x_n$. Finally, in analog implementations, only single line connections are needed connecting the elements of the system of FIG. 1.

In some applications, for example when implementing digital filters with RAMs, it is necessary to provide an address counter 10 for providing address signals AS to delay lines 1, 2, 3 and a clock 11 for providing sampling SS and clock CLS signals to multiplexer 4, delay lines 1, 2, 3 and address counter 10. Address AS, sampling SS and clock CL signals may also be needed to operate multipliers 6, 8 and integrators 5, 9 in some systems. It should be understood that address signals are applied to memories 1, 2, 3 on $\log_2 N$ lines. Clock 11 provides sampling SS and clock CL signals which synchronize the operation of delay lines 1, 2, 3, multiplexer 4, multipliers 6, 8 and integrators 5, 9 and for shifting signals $x_n$, $y_n$, $\alpha, \beta$ from instant to instant.

Delay lines 1, 2, 3, multiplexer 4, multipliers 6, 8 and integrators 5, 9 may be ones of a number of well known analog or digital units. For example, delay lines 1, 2, 3 may be surface acoustic wave (SAW) devices or charge coupled devices (CCD) both as described in the references by Squire, Special Issue IEEE Proceedings, or shift registers, read only memories (ROMs), programmable read only memories (PROMs), random access memories (RAMs), all as described in the references by Byram, Rabiner and Rader, Rabiner and Gold, U.S. Pat. 3,950,635, and the paper by Freeney. Clearly, when delay lines 1, 2, 3 are analog devices or ROMs the address counter 10 is not needed. Multipliers 6, 8, integrators 5, 9 and multiplexer 4 may be as shown in the foregoing references by Squire, Special Issue IEEE Proceedings Byram, Rabiner and Rader, Rabiner and Gold, U.S. Pat. 3,950,635 and the paper by Freeney.

The system of the invention can be implemented as an analog filter using any one of a number of materials, transducers, and delay lines, for example as shown in the Special Issue IEEE Proceedings. Also, the invention can be implemented as a digital filter using any one of a semiconductor or core technologies, including bipolar, transistor-transistor logic (TTL), emitter-coupled logic (ECL), metal-oxide semiconductor (MOS), charge coupled device (CCD), magnetic bubbles, magnetic cores, and so forth, the designations just given referring to well known manufacturing technologies. Thus, it will be appreciated by those in the art that a variety of analog and digital units and manufacturing technologies are available for carrying out the invention.

While the system of FIG. 1 is perfectly adequate in analog and some digital implementations of the invention, it is a well known fact in the digital filter art that the direct form of a filter is to be avoided because the accuracy requirements on the coefficients $\alpha, \beta$ are often severe. This situation may be helped by using the cascade and parallel implementations of digital filters. These comprise cascadings and parallelings of many low order direct form sections and require shorter word lengths to implement to obtain equivalent accuracy. Moreover, a careful examination of the capacity requirements (proportional to k) for momories and multipliers in FIG. 1 shows that these increase indefinitely with N.

Compared to the FIG. 1 system of Freeney, with 2 N multipliers, the FIG. 1 system of the invention has only 2 multipliers. While this is a great simplification in the actual number of multipliers there has been no corresponding simplification in the multiplier capacity since k, the number of word length bits (lines), from memory 1 to multipliers 6 and 8 propagates or increases for every feedback cycle. For example, $k=(n-1)b$ where $n=1, 2, \ldots, N$ and this fact requires increasing memory and multiplier capacity for elements 1, 6, 8 in the system of FIG. 1. It will be appreciated therefore that the memory 1 word length increases as $(n-1)b$, and the multiplier 6 capacity increases as nb. Table I shows the capacity for each element of FIG. 1 for the case N large.

TABLE I

| Capacity of Elements in FIG. 1 | |
|---|---|
| Element | Capacity |
| Delay line 1 | N × (N −1)b or N × R |
| 2 | N × a |
| 3 | N × b |
| Multiplier 6 | k × b |
| 8 | k × b |

The examination of Table I shows that the capacities of delay line 1 and multipliers 6, 8 involve k and therefore grow excessively as the number of words N increases. Thus, the high capacity of elements and accuracy limitations combine to make the system of FIG. 1 an inefficient one for all cases except for low order, for example N=2, recursive filters which can be cascaded and paralleled to obtain higher order filters.

Figure 2:
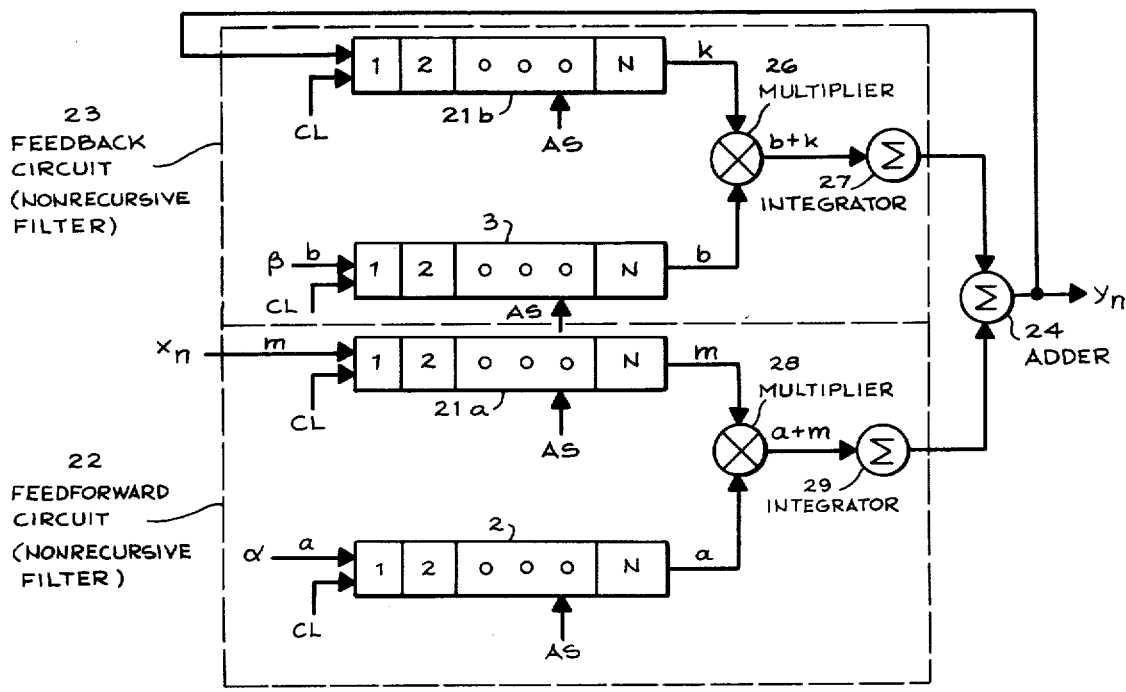
FIG. 2 is a block diagram of a direct canonical form of a recursive filter with separate data memories

FIG. 2 shows a direct form of a recursive filter with separate data memories 21a and 21b. The filter comprises the feedforward 22 and feedback 23 portions of a recursive filter with multipliers 26, 28 providing inputs to adder 24 through integrators 27, 29. If desired, integrators 27, 29 can be combined with adder 24. The output of adder 24 is fed back to delay line 21b. If desired, a decision circuit may be used between the adder 24 output and the delay line 21b input (not shown in FIG. 2) to operate the filter as an equalizer and to reduce the filter noise, for example as discussed in the cited Hirsch patent.

One advantage of the FIG. 2 configuration is that it can be implemented using two identical nonrecursive filters, for example using the digital filter and correlator of U.S. Pat. No. 3,950,635. Another advantage of the FIG. 2 configuration is the reduced capacity requirement for multiplier 28. Table II shows the capacity for elements of FIG. 2 for the case N large.

TABLE II

| Capacity of Elements of FIG. 2 | |
|---|---|
| Element | Capacity |
| Delay line 21a | N × m |
| 2 | N × a |
| 21b | N × (N −1)b or N × k |
| 3 | N × b |
| Multiplier 26 | k × b |
| 28 | m × a |

The examination of Table II shows that while the capacity of multiplier 28 has been reduced compared to the capacity of multiplier 8 in FIG. 1, this has been done at the expense of adding memory 21a. As before, the high capacity of the memory 21b and multiplier 26 is combined with the accuracy limitation to make the system of FIG. 2 an inefficient one for all cases except for low order, any N=2, recursive filters which can be cascaded and paralleled to obtain higher order filters.

From the foregoing it will be appreciated that if one implements a direct form recursive filter according to the well known teachings of the prior art, i.e., with 2 N multipliers, he will encounter the problems of capacity and accuracy. To overcome these limitations, the designer must cascade or parallel low order, for example N=2, recursive filters and this is the procedure indicated by the prior art. Moreover, the present invention in FIGS. 1 and 2 to replace the 2 N multipliers of the prior art with 2 multipliers in a direct form recursive filter while successful has not completely reduced the capacity and has not address the problem of accuracy. This will be done next.

Regarding the capacity and accuracy of a direct form recursive filter, the former increases while the latter decreases as a function of the number of words N. It will be appreciated if sequence $x_n$ is fed into a direct form recursive filter, for example the filters of FIGS. 1 and 2, whose elements are initially blank, i.e., without contents, the word length k gradually increases as the filter is stepped through cycles $n=1, 2, \ldots, N$ (in the time share filters of the invention) or along delay line taps $n=1, 2, \ldots, N$ (in prior art simultaneous filters). This is a simple consequence of the feedback (with or without recirculation) of data and is the source of the filter capacity and accuracy. By capacity is meant the size of memories, multipliers, etc., and by accuracy is collectively meant the various limitations including noise buildup, spreading of distortion, stability and convergence as well as the propagation of noise and errors in the filter. Thus, the accuracy of the filter will degrade from cycle-to-cycle or from tap-to-tap in the sequence of cycles or taps $n=1, 2, \ldots, N$, for example between samplings of signals $x_n$ (FIGS. 1 and 2 filters) or at samplings of signals $x_n$ (FIG. 1 filter of Freeney). And, the larger N is, the larger is the filter capacity and the less is the filter accuracy. This fact forms the basis of the invention to decrease the filter capacity and to increase its accuracy. For example, if 1 least significant bit of the m bit data word $x_n$ represents the noise or error of the sampled signal then this bit will propagate at the rate b per cycle or tap and increasing as $n=1, 2, \ldots, N$. This means the inaccuracy for $n=1$ is 1 bit, for $n=2$ is b bits, for $n=3$ is 2b bits, etc., and with corresponding increases per cycle or tap of the memory capacity.

If this growth or propagation of the filter capacity and inaccuracy (proportional to k) can be stopped, for example by rounding off the undesirable bits at each cycle or tap of the filter, then both the capacity and accuracy of the filter can be expected to improve. The capacity improves by virtue of the fact that fewer word bits of memory are utilized while the accuracy improves by a combination of facts including less noise being propagated in the filter and the filter stability becoming less critical. Significantly, this procedure allows for greatly increasing the accuracy simply by increasing the word length of data and coefficient words. In other words, this procedure allows for trading savings of memory and multiplier capacities due to the roundoff by slight increases of the memory and multiplier capacities needed to accommodate higher quantization of levels m, a, b of the data and coefficient words. Accordingly, the invention postulates decreasing the word length of memory and multiplier capacities by rounding off the error bits and then increasing the quantization of data and coefficient words to obtain higher accuracy as desired. In this manner, both the capacity and accuracy of the invention filter will be improved over the prior art direct form recursive filter.

Figure 3:
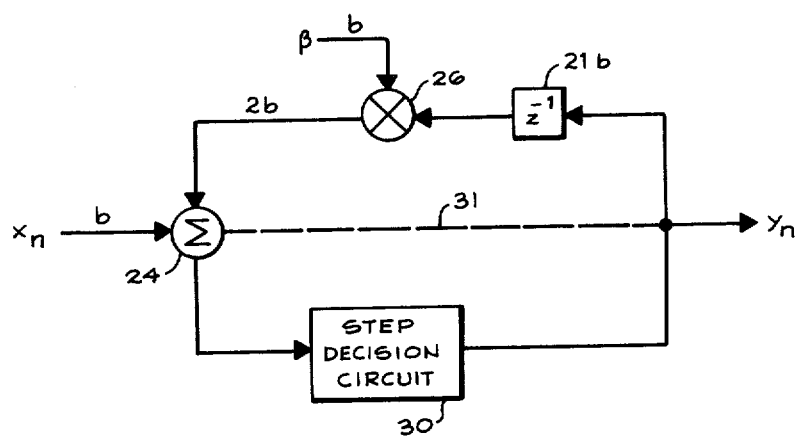
FIG. 3 is a block diagram of a first order recursive filter.

FIG. 3 shows a simple first order recursive filter with two alternative path connections. The dashed path 31 represents the prior art connection while the path which contains the decision circuit 30 represents the invention connection. Connections 30 and 31 are used as alternatives, by way of explanation. Using path 31, if the input word $x_n$ is quantized to b bits and the $\beta$ coefficient is quantized to b bits then after the first cycle, the second input to adder 24 will have 2b bits. If this recursion is carried out indefinitely, the number of bits required to represent the output of multiplier 26 and the word capacity of memory 21b grow linearly as nb where $n = 1, 2, \ldots, N$. The common solution of the prior art is to eliminate the low order bits resulting from the multiplication by rounding and truncation, for example as discussed at page 306 in the book by Rabiner and Gold. However, simple roundoff and truncation as suggested by the prior art is not satisfactory since this procedure does not track the increasing amplitude of words at the output of multiplier 26 but is only intended to operate a given window or dynamic range of words at the output of multiplier 26. This distinction between a tracking window of b bits which increases at the rate n specified by the invention and a fixed window specified by the prior art, is crucial since the former requires the least capacities for the memory 21b and multiplier 26. In contrast, if a step decision circuit 30, for example a b-pole N-throw switch, which selects b bits for each $n = 1, 2, \ldots, N$ step, is inserted between adder 24 and memory 21b or, alternatively, between multiplier 26 and adder 24, then the output of circuit 30 tracks its input b bits at a time. Thus, while the input of decision circuit 30, in its absence, and after n cycles, is nb bits its output, in its presence, is only b bits for each $n = 1, 2, \ldots, N$. The result of this tracking of its input amplitude by decision circuit 30 is that memory 21b need be implemented only having word length b, multiplier 26 as a $b \times b$ multiplier, and adder 24 as a $b+1$ adder. Clearly, the use of step decision circuit 30 permits the simplification of memory 21b from nb to b word length and of multiplier 26 from an $nb \times b$ to a $b \times b$ multiplier. It will be appreciated therefore that the FIG. 3 filter with step decision circuit 30 is more efficient than is the prior art circuit with path 31. Moreover, step decision circuit 30 improves the filter accuracy in a number of ways including acting as a noise threshold to suppress noise and by reducing the feedback, it tends to stabilize the filter.

Now, by increasing the quantization of data and coefficient words, the accuracy can be further improved to any level desired limited only by the state of art of quantizers (analog to digital converters, etc.). This then is the general procedure of the invention, i.e., to provide the step circuit 30 in a direct form recursive filter (conventional or with time sharing of multipliers as in FIGS. 1 and 2).

Figure 4:
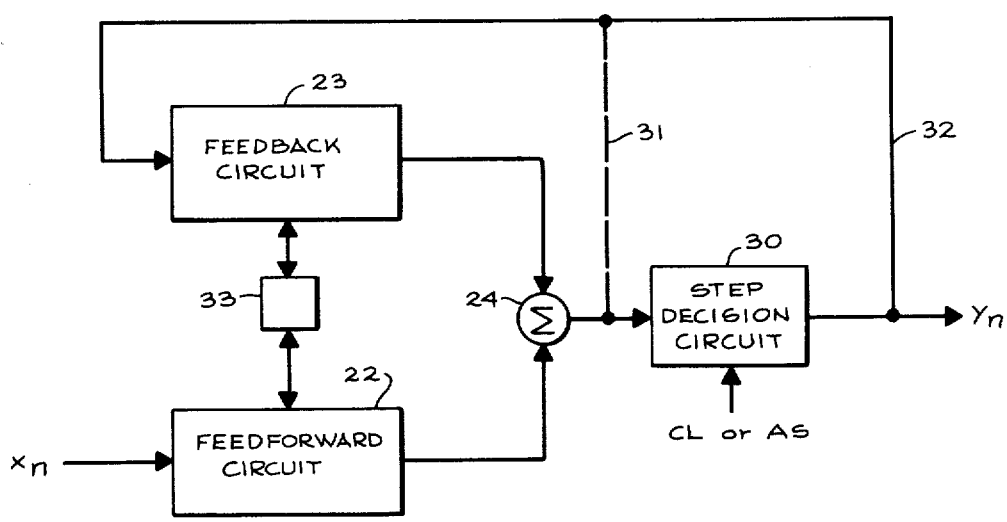
FIG. 4 is a simplified block diagram of the improved recursive filter of the invention.

FIG. 4 is a simplified block diagram of the improved recursive filter of the invention. The improved filter comprises the feedforward 22 and feedback 23 portions of a direct form recursive filter, for example the prior art FIG. 1 filter in Freeney or the recursive filters of FIGS. 1 or 2, or for that matter, a cascade or paralleling of recursive filters. Feedforward 22 and feedback 23 circuits are connected to the adder 24. One critical provision of the invention filter, namely, a step decision circuit 30, may be inserted in the feedback loop, for example between delay line 21b and multiplier 26 or, between multiplier 26 and integrator 27 or, between integrator 27 and adder 24 or, as shown in FIG. 4, between adder 24 and the data memory of feedback circuit 23 (delay line 21b in FIG. 2). Circuits 30 may be inserted at one or more of the locations just cited. If circuit 30 is inserted between delay line 21b and multiplier 26 or between multiplier 26 and integrator 27 it establishes a threshold for each cycle or tap of delay line 21b, i.e., N thresholds for every sampling of signal $x_n$. This will also be the case if circuit 30 is inserted between integrator 27 and adder 24 or between adder 24 and the input to delay line 21b. Thus, if the filter is a simultaneous (non-time sharing) filter, for example the FIG. 1 filter of Freeney or, if the filter is a sequential (time sharing) filter, for example the FIGS. 1 and 2 filters, then the insertion of circuit 30 between integrator 27 and adder 24 or between adder 24 and the input to delay line 21b will establish a threshold for every value of $y_n$, i.e., one threshold for every sampling of signal $x_n$. Thus, step decision circuit 30 when inserted between integrator 27 and the input to delay line 21b forms at least 1 threshold for each sampling of signal $x_n$ while when inserted between the output of delay line 21b and integrator 27 it forms N distinct thresholds, one for each cycle, tap or location $n = 1, 2, \ldots, N$ of delay line 21b.

Step decision circuit 30 may be a multipole-multithrow switch or a variable or stepping thresholder or quantizer. It may be completely automatic, for example a step counter thresholder, or it may be an adaptive circuit, for example an adaptive thresholder controlled by two or more inputs derived from elements of the filter. Step decision circuit 30 may include a (noise or data) filter or a correlator and may be controlled by clock 11 or address counter 10 in which case circuit 30 may be addressable. Thus, signals received by circuit 30 are thresholded or windowed continuously so that only those portions of signals exceeding the threshold or inside the window can be fed back to feedback circuit 23. This is unlike the more conventional approach where there is no step decision circuit 30 and, therefore, signals are fed back to feedback circuit 23 directly or through a fixed threshold for noise control. In the invention system, it is the removal of the noise and error components of signals by circuit 30 that improves the filter accuracy.

Decision circuits are well known in filters, for example as discussed in the Hirsch patent. However, these circuits are used either for adapting coefficients of a nonrecursive filter or for reducing the noise in both nonrecursive and recursive filters. Thus, in the prior art, decision circuits are fixed thresholders including fixed pulse regenerators and quantizers used for coefficient convergence and noise control but with no effect on the stability and error propagation problems of recursive filters. In contrast, step thresholder 30 of the invention is directed primarily to improve the stability and error propagation problems of recursive filters and secondarily to provide coefficient convergence (in adaptive filters) and noise control.

In the prior art, the output of adder 24 is connected directly to the feedback circuit 23, shown by the dashed line 31 in FIG. 4, or is connected to the feedback circuit 23 through a decision circuit for noise control, for example as discussed in the Hirsch patent or through a quantizer, for example as discussed in the Thong article. However, the prior art decision circuit is used to limit the filter noise, i.e., a fixed threshold for all samplings of signals $x_n$, and nowhere suggests a tracking or step decision circuit, i.e., a tracking or window threshold for every sampling of signal $x_n$. In contrast, the system of the invention specifies that the feedback circuit 23 can function properly when its input is obtained from adder 24 through a step decision circuit 30, for example as shown in FIG. 4.

By way of further explanation, consider the filter output $y_n$ at a discrete time, for example in accordance with equation (1). It will be appreciated that the intermediate products $a_i x_{n-i}$ and $\beta_j y_{n-j}$ contain both noise and error components, i.e., due to the coefficient and data word noise and error. However, the noise and error have different effects on the feedforward and feedback circuits 22 and 23, namely noise and the spreading of distortion more affect the feedforward circuit 22 while stability, coefficient convergence (in adaptive filters) and errors tend more to affect the feedback circuit 23. As indicated previously, the use of a fixed threshold by the prior art can be employed to reduce the noise but recursive filters with fixed thresholds for noise control retain the stability and error problems. The present invention recognizes the fact that the thresholding of errors may be applied to a recursive filter in addition to the thresholding of noise and, since errors propagate (multiply) and noise simply enhances (adds), the error threshold is a step threshold while the noise threshold is a fixed threshold. The term propagation is used to denote the predictable non-statistical multiplication of errors between taps or stages of the filter, while the term enhancement is used to denote a summation from a plurality of taps or stages of the filter. Thus, it is the nature of a recursive filter which determines the distinctly different effects of error propagation and noise enhancement. As in the prior art, the noise can be reduced by using a fixed threshold, for example a fixed threshold between adder 24 and the input to feedback circuit 23. However, the fixed threshold does not reduce the error propagation in the filter. It is for this reason that the prior art teaches the cascading or paralleling of low order recursive filters (as in Freeney) or the cascading of nonrecursive filters with noise thresholds (as in Hirsch).

Consider how an error propagates in the filter of FIG. 2. If sequence $x_n$ is quantized to m level, the last bit of the data word represents or contains the error. If the filter is initially blank (unfilled) of data and no other errors are present then the single error bit of $x_n$ will propagate through delay line 21a and will appear as a single error bit at the input to multiplier 28. Coefficient errors will propagate in a like manner in delay lines 2 and 3. In contrast, a one bit error of data word $y_n$ will propagate through delay line 21b appearing as a k bit error at the input to multiplier 26. In approximation (for N large compared to 1), $k=(n-1)b$ so the output of multiplier 26 has error Nb when $n=N$.

Consider now the action of a step decision circuit 30 inserted between multiplier 26 and integrator 27. The error is thresholded at each cycle, tap or stage of delay line 21b by a stepping threshold whose steps may be determined by the estimate for the error in each tap. The immediate result of the step thresholding by circuit 30 is the simplification of memory 21b, multiplier 26, integrator 27 and adder 24. Thus, the capacity of memory 21b and multiplier 26 may be reduced from $N^2 b$ to Nb representing a reduction by a factor N. In this manner, the memory 21b and multiplier 26 discard the noise and error portions of words circulating in feedback circuit 23 and retain only the useful portions of data. It will be appreciated that the suggested elimination of the noise and error components of words circulating in feedback circuit 23 does not fully improve the filter accuracy (it does improve the filter stability and convergence) but primarily it improves the filter efficiency, i.e., with fewer requirements for memory and multiplier capacity. However, it is this substantial improvement of the filter efficiency which now permits coefficient and data words to be quantized with more bits, longer word lengths, and thereby to obtain the added substantial improvement of the filter accuracy. For example, FIG. 5.34 in the cited reference of Rabiner and Gold shows a 1 order improvement in the filter accuracy for every 3–4 bit increase of the data word. It can be expected therefore this same type improvement can be obtained more easily using the invention filter because of its substantial efficiency over the prior art. This improvement will occur whether the invention filter is implemented in direct form, for example the FIG. 1 filter of Freeney or the filters of FIGS. 1 and 2, or as cascadings and parallelings of invention filters.

As is well known, the response of any filter has time sidelobes. By considering the time sidelobes as errors these can be removed or suppressed by using a step decision circuit 30 which therefore may act as a modulator of signals being processed in feedforward 22 and feedback 23 circuits. Thus, a step decision circuit 30 may be considered for feedforward circuit 22, for example inserted between feedforward circuit 22 and adder 24. In this manner, the spreading of distortion can be controlled in the filter. On the other hand, the stability of a recursive filter becomes a problem if the amount of feedback exceeds unity or if the attenuator 26 adjustments do not produce minimum mean square error (in an adaptive filter) the filter does not converge. Again, by considering the feedback relative to unity and by removing the errors as before, the stability and convergence of recursive filters will be improved using the invention step decision circuit 30.

In some applications it will be necessary to operate the filter as an adaptive filter or equalizer. This can be accomplished by using the output of a fixed or step decision circuit 30 to modify the filter coefficients, for example through a circuit means 33. The connection between circuit 30 and means 33 is not shown to preserve the clarity in FIG. 4. For example, means 33 may be a step decision circuit 30 inserted between the output of either memory 2 and 3 and its respective multiplier 26 and 28. In this manner a decision made at the filter output is used to modify the filter coefficients as is well known and appreciated in the prior art, for example in the cited Hirsch patent.

In other applications it may be necessary to provide monitoring and blanking means 33 for periodically detecting the filter operation and for blanking the filter contents. For example, the detecting and monitoring portion of means 33 monitors some particular problem of the filter such as noise, error, stability, overflow, limit cycles, etc., while the disabling or blanking portion of means 33 blanks or discharges memories and multipliers of the filter. Thus, means 33 may include a fixed or step decision circuit 30 for the measurement of noise or errors or may include a frequency or spectrum analyzer for the detection of frequency oscillations in the filter and may include switches for blanking all or portions of the filter.

Up to this point the invention filter has been disclosed in terms of digital filters. However, analog filters may be used as feedforward 22 and feedback 23 circuits, for example a FIG. 4 filter may be implemented with feedforward 22 and feedback 23 circuits as the nonrecursive analog filters of Swan. In this case all lines connecting elements of the filter are single lines and step decision circuit 30 is now a sawtooth or swept threshold whose period may equal the transit delay time of signals through the filter memory.

The following Table 3 compares the relative advantages and disadvantages of the prior art nonrecursive, decision-recursive (fixed threshold for noise), and the invention filters.

TABLE 3

| Comparison of Prior Art and Invention Filters | | | |
| --- | --- | --- | --- |
| Limitation | Nonrecursive | Decision Recursive | Invention |
| Noise enhancement | Yes | Partial | No |
| Spreading of Distortion | Yes | Partial | No |
| Stability | Stable | Possibly unstable | Stable |
| Convergence | Yes | Possible no | Yes |
| Error propagation | No | Yes | No |
| Degrades for input echoes | No | Yes | No |

The invention filter overcomes in large measure the problems of two important types of prior art filters. The noise enhancement and spreading of distortion problems of prior art filters have been substantially reduced in the invention filter which also retains the stability and convergence advantages of prior art nonrecursive filters. Importantly, it is the error propagation problem which is solved by the invention filter compared to the prior art recursive filter. There are many important applications therefore that can be best served by the invention filter.

To illustrate the invention improvements over the prior art, consider the implementation of a recursive filter having $N=1,024$ words and word length $m=8$ bit. According to the prior art, this can be accomplished using 512 two pole filters in cascade or parallel. Using Advanced Micro Devices AM 25LS14 and AM 25LS15 (multiplier and adders) and forming a second order filter, as shown at page 17 in the book edited by J. Mick "Digital Signal Processing Handbook" Advanced Micro Devices, Inc., 1976, requires a total of 16 bits of memory, 8 LS15 adders and 5 LS14 multipliers. Thus, 512 such filters require a total of 8,192 bits of memory, 4,096 adders and 2,560 multipliers to implement the 1,024 word filter. In contrast, the invention system (FIG. 2) requires 32,768 bits of memory, 5 LS15 adders and 2 LS14 multipliers with 4 LS22 shift registers (for buffering multipliers) to implement the filter. In addition, the invention system requires a 1,024 step decision circuit 30 whose 8 bit threshold varies between steps 1 and 1,024 as a function of the cycle of memory 21b. In other words the invention system may be implemented with a significant reduction in the number of adders and multipliers offset by a fourfold increase in the size of bulk memory and addition of a step decision circuit 30. Moreover, the prior art implements fixed coefficients $\alpha$, $\beta$ while the system of the invention is fully programmable. Thus, fewer memory bits (by $\frac{1}{2}$) are needed for implementing the invention with fixed coefficients for which delay lines 2 and 3 are not needed and can be replaced by fixed voltages (zeros and ones). Moreover, the cascading and paralleling of low order invention filters will not change its total memory requirement but will increase the number of multipliers and step decision circuits to achieve the comparable accuracy of the prior art filter. Still, the invention filter will retain its efficiency by a substantial amount over the prior art filter. Of course, the accuracy of both systems can be increased by increasing the word quantization, say from 8 to 12 bits, and this is done more efficiently in the invention filter. This then is one example of the size, power consumption and cost benefits of the efficient invention system over the prior art.

One distinguishing feature of the invention is the preferred use of a prior of multipliers compared to the 2 N multipliers used in the prior art when implementing N-word recursive filters. However, while feedforward and feedback circuits 22 and 23 have been disclosed primarily in terms of dual multipliers 26 and 28, it will be understood that these circuits can be implemented as any one of a number of prior art filters, for example using the Croisier method wherein bulk memory is used to eliminate the use of multipliers altogether. A second distinguishing feature of the invention is the preferred use of a step decision circuit 30 to improve the filter efficiency and to improve its performance. Finally, a third distinguishing feature of the invention is the preferred use of highly quantized coefficient and data words when operating the filter.

The invention can be implemented on a single board or small number of boards as a microprocessor using readily available off-the-shelf analog and digital delay lines, multipliers, integrators, and multiplexers, and for as many words N and word lengths m as may be desired. The invention can also be implemented using large scale integration (LSI) techniques. The investment using off-the-shelf units is low and consists mainly of the normal board stuffing costs. The investment needed for LSI is also minimal being incremental over costs of existing off-the-shelf units.

The real time implementations of analog and digital filters are now becoming increasingly prevalent in such diverse areas as biomedical engineering, acoustics, sonar, radar, seismology, speech communication, data communication, nuclear science, and image processing. In many such applications it is desirable to combine efficiency and accuracy over the prior art. Such applications might require operations in computers or hardwired filters including matched clutter filtering for echo ranging or for coherent communications systems, cross correlation for interferometric analysis or for signal identification, spectrum analysis for passive detection and classification, and general transformations on data vectors. Modern filters, for example matched filters, correlators and convolvers, are signal processing devices which make computations in excess of the capabilities of large computers. Options for the implementation of filters include both analog and digital means, their full potential being limited by the technical efficiency and economic availability of practical hardware. Filters have found use in such sophisticated signal processing tasks as bit synchronization, bit detection, error correction, coding, pulse compression, synthetic aperture processing, and other applications. Since filters increase their complexity and decrease their efficiency as their word capacities N and word lengths m increase, the system of the invention prevails over the prior art by virtue of the fact that it offers inherently large word capacity N and word length m per unit hardware needed. In particular, the system of the invention is expected to make significant reductions in the size, power consumption and cost of filters in applications involving the computing and signal processing arts including radar, sonar, the communications areas of television and modile radio, seismic, speech and medical signal processing, and, image processing.

Although a number of particular configurations of the invention filter have been described, it should be understood that the scope of the invention should not be limited by the particular embodiments of the invention shown by way of illustration but rather by the appendant claims.

What is claimed is:

1. A recursive filter characterized by increased efficiency and accuracy and comprising:
   a feedforward circuit having as input the data sequence $x_n$ and coefficient sequence $\alpha$,
   said feedforward circuit having first data and coefficient memories and at least one feedforward multiplier and integrator;
   a feedback circuit having as input the data sequence $y_n$ and coefficient sequence $\beta$,
   said feedback circuit having second data and coefficient memories and at least one feedback multiplier and integrator;
   a step decision circuit connected in at least one of said feedforward and feedback circuits; and
   means connecting said feedforward and feedback circuits for forming said recursive filter, with said step decision circuit including means for establishing a threshold for each value of n, said filter having as input the data sequence $x_n$ and providing as output the data sequence $y_n$ where $n = 1, 2, \ldots, N$.

2. The recursive filter as defined in claim 1 in which said feedforward and feedback multipliers are bulk memories.

3. The recursive filter as defined in claim 1 in which said feedforward and feedback circuits are nonrecursive filters.

4. The recursive filter as defined in claim 1 in which said feedforward and feedback circuits are digital circuits.

5. The recursive filter as defined in claim 1 in which said feedforward and feedback circuits are analog circuits.

6. The recursive filter as defined in claim 1 connected in cascade with a like filter.

7. The recursive filter as defined in claim 1 connected in parallel with a like filter.

8. The recursive filter as defined in claim 1 including means connected for operating said filter as an adaptive filter (equalizer).

9. The recursive filter as defined in claim 1 including means for monitoring and blanking at least portions of said filter.

10. The recursive filter as defined in claim 1 including:
    address counter means connected to at least one of said memories for addressing storage locations of same; and
    clock means connected to said address counter and to said addressed memories for controlling the timing operation of the filter.

11. The recursive filter as defined in claim 1 including at least one of an address counter and clock means connected to said step decision circuit.

12. The recursive filter as defined in claim 1 wherein $\alpha = 0$.

13. A method for the implementation of recursive filters characterized by increased efficiency and accuracy and including the steps of:
    inputting data sequence $x_n$ and coefficient sequence $\alpha$ to a feedforward circuit having data and coefficient memories and at least one multiplier and integrator;
    inputting data sequence $y_n$ and coefficient sequence $\beta$ to a feedback circuit having data and coefficient memories and at least one multiplier and integrator;
    connecting a step decision circuit in at least one of said feedforward and feedback circuits; and
    connecting said feedback and feedforward circuits to form a recursive filter, with said step decision circuit establishing a threshold for each value of n, said filter having as input the data sequence $x_n$ and providing as output the data sequence $y_n$ where $n = 1, 2, \ldots, N$.

14. The method of claim 13 including the step of providing said recursive filter in the form of a cascade recursive filter.

15. The method of claim 13 including the step of providing said recursive filter in the form of a parallel recursive filter.

16. The method of claim 13 including the step of providing said feedforward and feedback circuits as nonrecursive filters.

17. The method of claim 13 including operating said feedforward and feedback circuits as analog circuits.

18. The method of claim 13 including operating said feedforward and feedback circuits as digital circuits.

19. The method of claim 13 including the step of operating said filter as an adaptive filter (equalizer).

20. The method of claim 13 including the step of monitoring and blanking at least portions of said filter.

21. The method of claim 13 including the steps of:
    addressing storage locations of at least one of said memories; and
    controlling the timing operation of the filter.

22. The method of claim 13 including the step of addressing the timing operations of said step decision circuit.

23. The method of claim 13 including the step of controlling the timing operations of said step decision circuit.

24. The method of claim 13 including operating said filter with $\alpha = 0$.

25. The method of claim 13 including the step of providing said feedforward and feedback multipliers as bulk memories.

* * * * *